US007492199B2

(12) United States Patent
Barwin et al.

(10) Patent No.: US 7,492,199 B2
(45) Date of Patent: Feb. 17, 2009

(54) FULLY SYNCHRONOUS DLL WITH ARCHITECTED UPDATE WINDOW

(75) Inventors: John E. Barwin, Essex Junction, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 11/460,638

(22) Filed: Jul. 28, 2006

(65) Prior Publication Data

US 2008/0025447 A1 Jan. 31, 2008

(51) Int. Cl.
*H03L 7/06* (2006.01)

(52) U.S. Cl. ...................................................... 327/158

(58) Field of Classification Search .................. 327/158
See application file for complete search history.

(56) References Cited

U.S. PATENT DOCUMENTS 5,604,775 A 2/1997 Saitoh et al.
6,856,415 B1 2/2005 Simchik et al.
7,061,287 B2 6/2006 Jeon
2004/0130366 A1* 7/2004 Lin et al. .................... 327/158
2005/0093597 A1* 5/2005 Kwak ......................... 327/158

* cited by examiner

*Primary Examiner*—Kenneth B Wells
*Assistant Examiner*—John W Poos
(74) *Attorney, Agent, or Firm*—Gibb & Rahman, LLC; Riyon Harding, Esq.

(57) ABSTRACT

The invention provides for a method for architecting a delay locked loop clock signal comprising: providing at least one clock signal to a clock signal splitter; alternately outputting the at least one clock signal from the clock signal splitter on at least two matched delay lines; alternately propagating the clock signal down each of the at least two matched delay lines; specifying a delay period for each of the matched delay lines with a control signal; updating said the two matched delay lines with the control signal when a fixed update window is always present on the matched delay lines; and distributing the clock signal to synchronously update the at least two matched delay lines, wherein no transitions are present in the fixed update window on the matched delay lines. Collect clock pulse outputs from the delay lines and reconstruct a delayed version of the input clock.

2 Claims, 2 Drawing Sheets

FULLY SYNCHRONOUS DLL WITH ARCHITECTED UPDATE WINDOW

BACKGROUND

1. Field of the Invention

The embodiments of the invention generally relate to clock delay line sharing, and, more particularly, to delay locked loop clock recovery circuits.

2. Description of the Related Art

Binary weighted delay lines are commonly used in delay locked loop (DLL) clock recovery circuits. The DLL must add delay so that the output data is aligned to the external clock. The delay added is equal to the external clock cycle time, minus all fixed internal delays assumed in receiving, managing, distributing, and driving the clock through the OCD (Off Chip Driver). One of the difficulties in using a binary weighted DLL line is that one must find an appropriate time to update the control bits which control how much delay the line is to add to the clock path. The update must occur at a time that does not affect any current delay that is being managed by the DLL line. In practical situations, it is possible to have a continuously transitioning delay line, where there is no stable time to update the control bits. Any attempt to update the delay line while it is transitioning can result in spurious pulses being generated by transitional glitches.

One method used in the art to resolve the dilemma pose by delays through the circuit is to create a pulse whose duration is a fraction of the incoming clocks pulse to send through the delay line. Because of the reduced duty cycle, it is possible to create a period of time when the delay line is idle and can be updated. In this method the pulse must be carefully sized so that it remains valid for all process possibilities, and must be resized with each technology change and application to ensure functionality and avoid timing hazards. Thus, the update window is small and completely dependent upon the pulse width and internal clock path delays. In addition, longer cycle times require the pulse to travel the delay for a longer period of time, increasing risk due to pulse width modulation.

U.S. Pat. No. 7,061,287, herein incorporated by reference, is directed to a delay locked loop that is reset to the initial state when a frequency of the clock applied from an external chipset is varied.

U.S. Pat. No. 6,956,415, herein incorporated by reference, provides a modular DLL architecture capable of generating a plurality of multiple phase clock signals for synchronization of embedded DRAM systems with on chip timing.

U.S. Pat. No. 5,604,775, herein incorporated by reference, provides for a DLL clock circuit having multiple delay lines.

U.S. Pat. No. 5,604,775, herein incorporated by reference, teaches a delay-locked loop circuit including a variable delay circuit that outputs a delayed clock signal.

SUMMARY

In view of the foregoing, an embodiment of the invention provides for a method for synchronizing a delay locked loop clock signal comprising: providing at least one clock signal to a clock signal splitter; alternately outputting the at least one clock signal from the clock signal splitter on at least two matched delay lines; alternately propagating the clock signal down each of the at least two matched delay line; specifying a delay period for each of the matched delay lines with a control signal; updating said the two matched delay lines with the control signal when a fixed update window is always present on the matched delay lines; and distributing the clock signal to synchronously update the at least two matched delay lines, wherein no transitions are present in the fixed update window on the matched delay lines. Reassembling the alternating split clock pulses from the output of the two or more matched delay lines to recover a delayed version of the input clock.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1A:
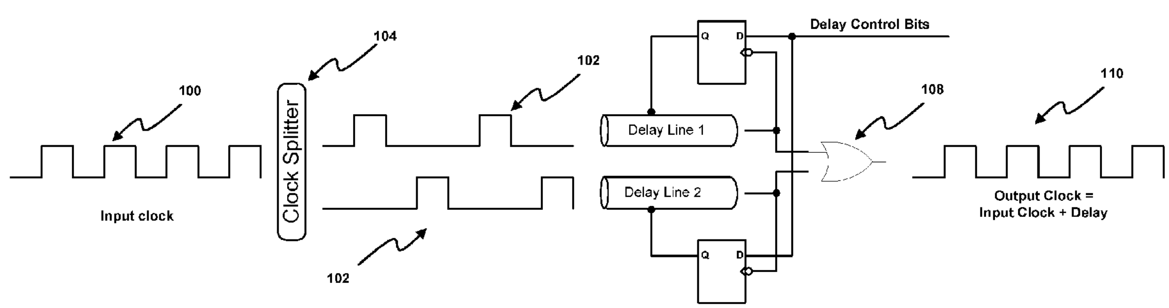
FIG. 1 illustrates a schematic diagram of a clock signal distributed through a clock signal splitter.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need to allow for a clear fixed synchronous update windows for binary weighted delay lines that are independent of architectures. The embodiments of the invention achieve this by providing a circuit architecture that will allow a fixed update window for the binary weighed delay line. Referring now to the drawings, and more particularly to FIGS. 1 through 2, where similar reference characters denote corresponding features consistently throughout the figures, there are shown preferred embodiments of the invention.

Figure 1B:
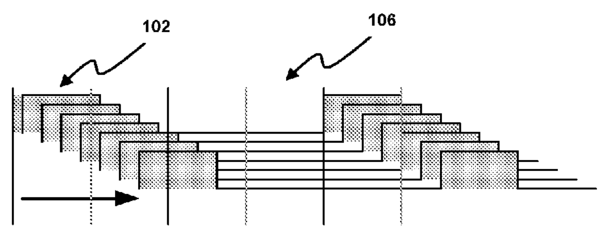
Figure 2:
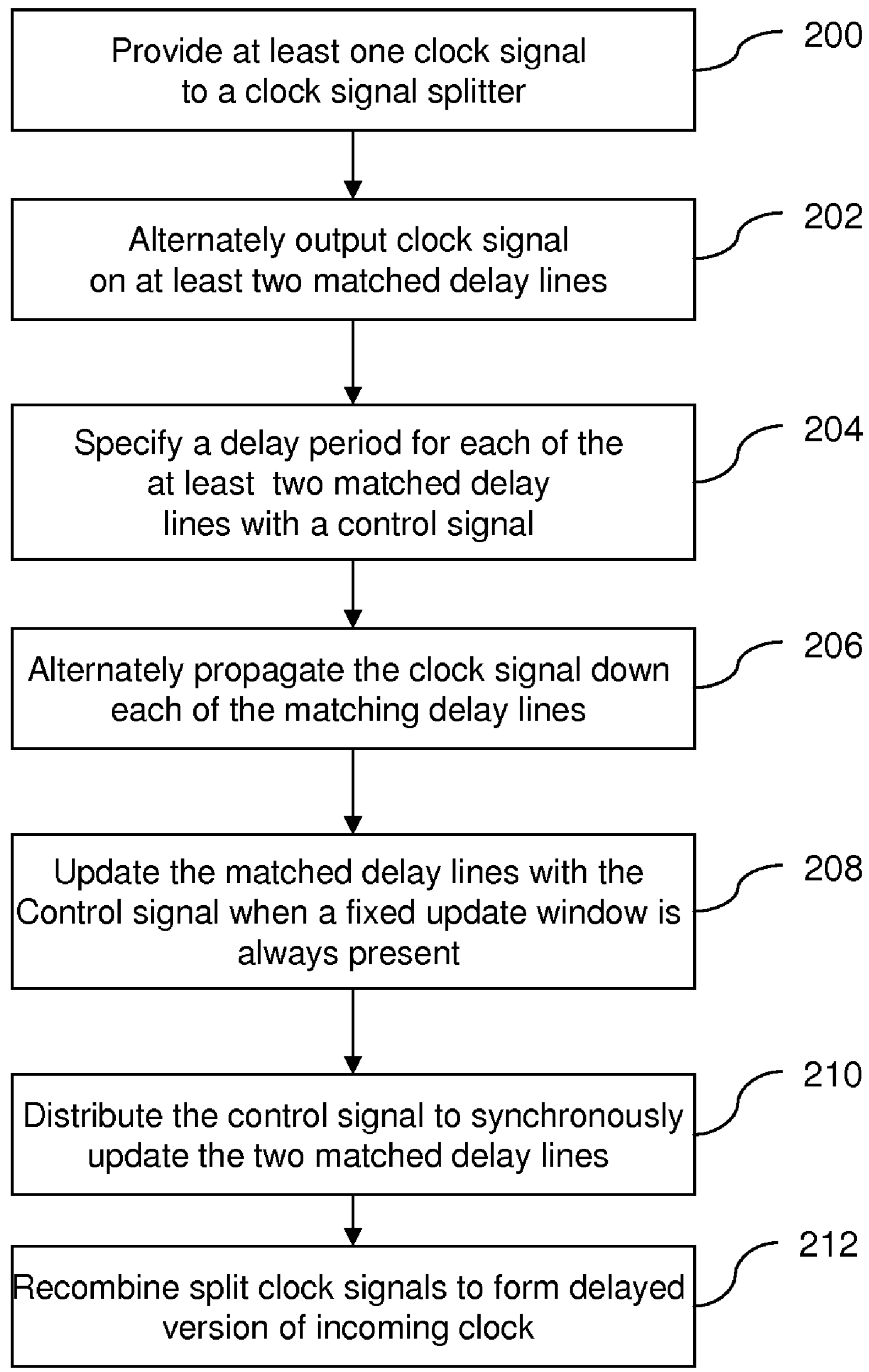
FIG. 2 is a flow diagram illustrating a preferred method of an embodiment of the invention.

FIG. 1*a* and FIG. 1*b* schematically illustrate the elements of the present invention. FIG. 1*a* illustrates exemplifies a preferred embodiment of the invention which provides for a method of ensuring a fixed finite time that there will be no transitions occurring in the delay line. FIG. 1*a* shows an incoming clock signal (100) distributed by a clock signal splitter (104) into two matching delay lines so that alternate pulses are presented to each delay line (102). The clock pulses propagate down each matched delay line, and are recombined at the end of the delay lines (108) to create a delayed version of the incoming clock (110). FIG. 1*b* illustrates the clock cycle (102) propagating down one of the delay line, and shows the fixed idle time in which the delay line can be safely updated (106) if one clock is divided into two delay lines.

FIG. 2, exemplifies a preferred embodiment of the invention which provides for a method for synchronizing a delay locked loop clock signal circuit comprising: providing at least one clock signal to a clock signal splitter (200) alternately outputting the at least one clock signal by the clock signal splitter on at least two matched delay lines (202); alternately propagating the at least one clock signal down each of the at least two matched delay lines by the signal splitter (204); specifying a delay period for each of the at least two matched delay lines with a control signal (206); updating the at least two matched delay lines with the control signal when a fixed update window is always present on the at least two matched delay lines (208); distributing the control signal to synchronously update the at least two matched delay lines (210); and recombining the split clock signals to form a delayed version of the incoming clock, wherein no transitions are present in the fixed update window on the at least two matched delay lines. The synchronous update occurs within the fixed update window and the fixed update window is equal to at least a mimic delay of a circuit minus any duty cycle tolerance of the clock. The mimic delay of the circuit is the sum of the inherent delay of the receiver in the circuit and the inherent delay of the off chip driver.

More particularly, binary weighted delay line architecture is often incorporated into DLL clock recovery circuits. By way of example, an external clock (CLK) may pass through a receiver, DLL and off chip driver (OCD) before it is presented to the output pad of the chip (DQ). Each circuit that the clock signal passes through will impart a delay in the clock signal. The delay through the receiver to the DLL is denoted as $\tau_{RCV}$. The delay through the DLL when the control bits are requesting no added delay is denoted as $\tau_{INS}$. $\tau_{INS}$ represents the minimum delay through the DLL. The delay from the DLL through the OCD will be denoted as $\tau_{OCD}$. The total minimum delay to push the clock through the chip is $\tau_{RCV}+\tau_{INS}+\tau_{OCD}$. Therefore, in order to have the output clock (DQ) aligned with the input clock (CLK), the DLL adds a full clock cycle ($\tau_{CYC}$) minus the inherent delay ($\tau_{RCV}+\tau_{INS}+\tau_{OCD}$).

The equation to describe the amount of delay the DLL must add is $\tau_{DLL\_DELAY}=\tau_{CYC}-\tau_{RCV}-\tau_{INS}-\tau_{OCD}$. The delay line is always transitioning when the DLL adds delay in excess of ½ $\tau_{CYC}-\tau_{INS}-\tau_{DCTOL}$ where $\tau_{DCTOL}$ is the duty cycle tolerance of the clock cycle (nominally 0 if 50% of the cycle the clock is high and 50% of the cycle the clock is low). To handle longer delays (cycle times), modifications must be induced for the delay line to have an idle period in which it can be updated. Referring back to FIG. 1*a*, the figure shows that if the above single clock implementation is used, an architected update window that will have no transitions will always be ½ $\tau_{CYC}+\tau_{RCV}+\tau_{OCD}-\tau_{DCTOL}$. During this update window, when the delay line is not transitioning, the delay control bits can be changed.

A conventional approach is to reduce the duty cycle of the clock that is presented to the delay line. While this approach is functional, it does require that a circuit adjust the pulse width so that it is wide enough to travel the delay line without excessive attenuation, but narrow enough to allow an update window for the delay line. This pulse width adjustment requires knowledge and careful modeling of the clock system the DLL is to be placed in.

In view of the foregoing, the invention disclosed herein deals with a binary weighted delay line used in a DLL Clock recovery circuit by providing a clear synchronous window for updating. More particularly, this invention allows for a fully synchronous line. It uses matched delay lines, and divides up the clock pulses placed into each delay line. This delay line duty cycle allows for clear, architecturally fixed update windows, and allows the signal in the delay line to scale with the cycle time. Such architecture allows the delay line to be technology mapped with little extra design effort. The present invention uses multiple matched delay lines to distribute the clock pulses in a manner to allow clear synchronous update windows. In the case of a single clock DLL, every other clock pulse can be propagated down alternating delay lines. The single clock system creates a worst case fixed update window equal to one half cycle plus the mimic delay minus any pulse width modulation.

Even more particularly, the invention can be extended to a multiple clock DLL with increased efficiencies. By way of example, two complimentary clocks are supplied with the rising edge of each requiring recovery (a differential clock system). By using the present method in a two clock system a fixed update window can be architected in a two clock system by arbitrating three delay lines to pass the two clocks. The two clock system creates a worst case fixed update window equal to the mimic delay minus any pulse width modulation. Since the mimic delay is usually much greater than the pulse width modulation in most applications, the architecture ensures a clean update window. It is understood that the present discussion of a two clock system is in no way limiting of the invention. Those of skill in the art would understand that any number of clock signals may be combined with any number of delay lines using the present method.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method for architecting a delay locked loop clock signal circuit comprising:

providing at least one clock signal to a clock signal splitter;

alternately outputting said at least one clock signal from said clock signal splitter on at least two matched delay lines; and alternately propagating every other clock pulse of said at least one clock signal down each of said at least two matched delay lines by said signal splitter, specifying a delay period for each of said at least two matched delay lines with a control signal;

updating said at least two matched delay lines with said control signal when a fixed update window is always present on said at least two matched delay lines;

distributing said control signal to synchronously update said at least two matched delay lines; and combining said pulses from the output of said two matched delay lines, wherein a delayed a delayed version of said at least one clock signal is recovered, wherein said synchronous update occurs with said fixed update window, said fixed update window is equal to at least a mimic delay of a circuit reduced by a duty cycle tolerance of said at least one clock signal.

2. A method for architecting a delay locked loop clock signal circuit comprising:

providing at least one clock signal to a clock signal splitter;

alternately outputting said at least one clock signal from said clock signal splitter on at least two matched delay lines; and alternately propagating every other clock pulse of said at least one clock signal down each of said at least two matched delay lines by said signal splitter, specifying a delay period for each of said at least two matched delay lines with a control signal;

updating said at least two matched delay lines with said control signal when a fixed update window is always present on said at least two matched delay lines; and distributing said control signal to synchronously update said at least two matched delay lines, wherein no transitions are present in said fixed update window on said at least two matched delay lines, wherein said synchronous update occurs within said fixed update window, said fixed update window is equal to at least a mimic delay of a circuit.

* * * * *